United States Patent [19]

Isobe

[11] Patent Number: 5,716,872
[45] Date of Patent: Feb. 10, 1998

[54] METHOD OF MANUFACTURING MULTILAYER INTERCONNECTION STRUCTURE HAVING A DIELECTRIC FILM WITH IMPROVED FLATNESS

[75] Inventor: Akira Isobe, Tokyo, Japan

[73] Assignee: NEC Corporation, Tokyo, Japan

[21] Appl. No.: 563,201

[22] Filed: Nov. 27, 1995

[30] Foreign Application Priority Data

Nov. 29, 1994 [JP] Japan ................... 6-294866

[51] Int. Cl.⁶ .............................. H01L 21/469
[52] U.S. Cl. .................. 437/195; 437/228; 437/231
[58] Field of Search ..................... 437/195, 231, 437/245, 228 ION, 228 PL, 228 POL

[56] References Cited

U.S. PATENT DOCUMENTS

| | | |
|---|---|---|
| 4,906,594 | 3/1990 | Yoneda et al. |
| 4,952,274 | 8/1990 | Abraham. |
| 5,091,048 | 2/1992 | Thomas. |
| 5,192,697 | 3/1993 | Leong ................................. 437/37 |
| 5,203,957 | 4/1993 | Yoo et al. |
| 5,270,264 | 12/1993 | Andideh et al. ................. 437/228 |
| 5,429,990 | 7/1995 | Liu et al. ........................ 437/190 |
| 5,453,403 | 9/1995 | Meng et al. |
| 5,496,776 | 3/1996 | Chien et al. ..................... 437/231 |

Primary Examiner—John Niebling
Assistant Examiner—C. Everhart
Attorney, Agent, or Firm—Young & Thompson

[57] ABSTRACT

A wiring pattern is formed on an insulating film provided on one major surface of a semiconductor substrate. Then, a first dielectric film covering the wiring pattern is formed. A second dielectric film is formed on the first dielectric film by coating and baking. Then, the second dielectric film is etched until at least a part of the first dielectric film on steps of the wiring pattern is exposed. The steps between the first dielectric film and the second dielectric film are smoothed by the irradiation of the entire surface with low energy ions. Then, a third dielectric film is formed covering the first and second dielectric films.

7 Claims, 4 Drawing Sheets

METHOD OF MANUFACTURING MULTILAYER INTERCONNECTION STRUCTURE HAVING A DIELECTRIC FILM WITH IMPROVED FLATNESS

BACKGROUND OF THE INVENTION

The present invention relates to a method of manufacturing a semiconductor device, and more particularly, to a method of manufacturing a semiconductor device effective in the flattening of a dielectric film.

Accompanying the advances toward higher levels of integration of semiconductor devices, multilayer interconnection technology is becoming the more important. In the multilayer interconnection technology, the improvement of the dielectric films with more stability and more flatness, in addition to the improvement of the wirings themselves used therein, is important.

To begin with, the method of manufacturing semiconductor devices employing conventional multilayer interconnection technology will be described. An insulating film is formed on a semiconductor substrate with elements such as transistors formed thereon, a lower metal wiring pattern is formed on the insulating film, and a first silicon oxide film covering the insulating film and the lower metal wiring pattern is formed by CVD method. Because protrusions are formed in the first silicon oxide film corresponding to the edge parts of the metal wiring pattern, steps are formed on the surface of the first silicon oxide film. Then, a spin-on-glass (SOG) film with a flattened surface is formed by coating the surface with an alcoholic solution of a silicon compound and subjecting the substrate to baking, in order to reduce the level difference formed on the surface of the first silicon oxide film. Then, the substrate is etched in order to expose the surface of the silicon oxide film above the lower metal wiring pattern by removing the SOG film. Then, a second silicon oxide film covering the SOG film and the exposed first silicon oxide film is formed by CVD method. Then, the lower metal wiring pattern is exposed by forming a via hole in the first and the second silicon oxide films above the lower metal pattern. Then, an upper metal pattern connected to the lower metal pattern through the via hole is formed on the second silicon oxide film. In this way, a multilayer interconnection structure having the first and the second silicon oxide films and the SOG film as a dielectric film is formed.

In the conventional method of manufacturing the semiconductor device, since the etching rate of the SOG film is larger than the etching rate of the first silicon oxide film formed by CVD method, the edge parts of the first silicon oxide film are exposed. Therefore, level difference between the first silicon oxide film and the SOG film are formed. When the second silicon oxide film is formed following that, the surface of the second silicon oxide film reflects the level difference between the first silicon oxide film and the SOG film, and generates a problem that the flatness of the dielectric film is deteriorated.

SUMMARY OF THE INVENTION

It is therefore the object of the present invention to provide a method of manufacturing a semiconductor device having a dielectric film with improved flatness.

The method of manufacturing a semiconductor device according to this invention includes a step of forming a wiring pattern on an insulating film provided on one principal surface of a semiconductor substrate, a step of forming a first dielectric film on the entire surface including the wiring pattern, a step of forming a second dielectric film on the first dielectric film by coating and baking, a step of etching back the second dielectric film until at least a part of the first dielectric film over the wiring pattern is exposed, a step of irradiating the first and the second dielectric films with ions, and a step of forming a third dielectric film on the first and the second dielectric films.

According to this invention, edge parts and their vicinity of the exposed first dielectric film acquire tapered shapes owing to the ion irradiation, and a level difference between the first dielectric film and the second dielectric film can be relaxed. Since the third dielectric film is formed on the first dielectric film and the second dielectric film with relaxed level difference, it is possible to further flatten the surface of the third dielectric film. Therefore, it is possible to improve the flatness of a dielectric film consisting of the first through the third dielectric films. Moreover, as a result of the ion irradiation, since the surface portion of the second dielectric film can be densified by promoting the bonding of the uncoupled bonds existing in the second layer insulating film, the absorption of the moisture to the second dielectric film can be lowered easily. In this way, the outgassing from the second dielectric film can be precluded, and the corrosion of the wiring pattern due to the outgassing can be prevented.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1A:
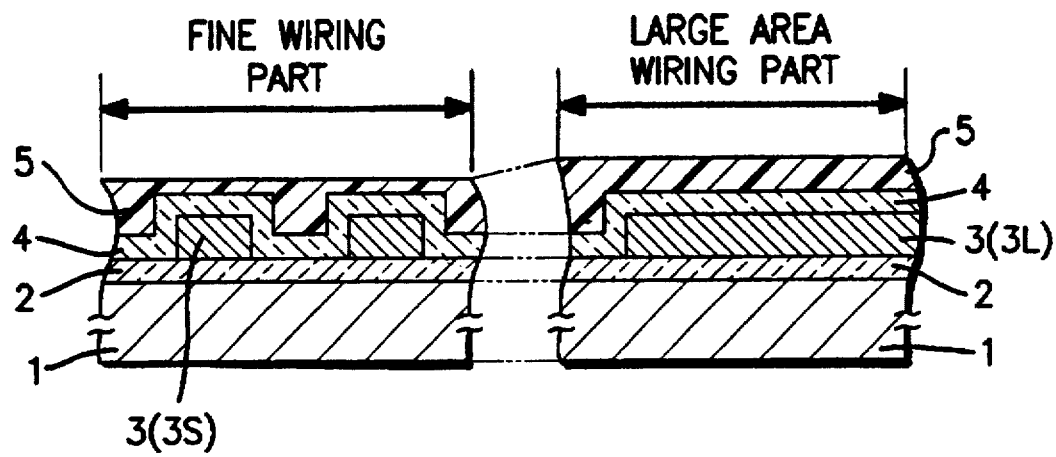
FIG. 1(A) to FIG. 1(C) are sectional views arranged in the order of manufacturing processes to describe a conventional method of manufacturing the semiconductor device.

Before preceding to the description of the embodiments of this invention, the prior art will be described in detail by referring to the drawings.

First, in FIG. 1(A), a lower metal wiring pattern 3 consisting of an aluminum based alloy is formed on an insulating film 2 on a semiconductor substrate 1, and a 0.5 μm-thick silicon oxide film (referred to as plasma oxide film hereinafter) 4 is formed by plasma CVD method. Then, the surface is coated with an alcoholic solution of a silicon compound, followed by subjecting the sample to a heat treatment at 400° C., and thereby a flattened baked SOG film 5 having a thickness of 0.3 μm on the flat part is obtained. The SOG film 5 has a thickness of 0.3 μm on the plasma oxide film 4 above a broad first wiring part 3L of the metal wiring pattern 3 with a large width, but has a thickness of 0.1 μm on the plasma oxide film 4 above a fine second wiring part 3S with a small width.

Figure 1B:
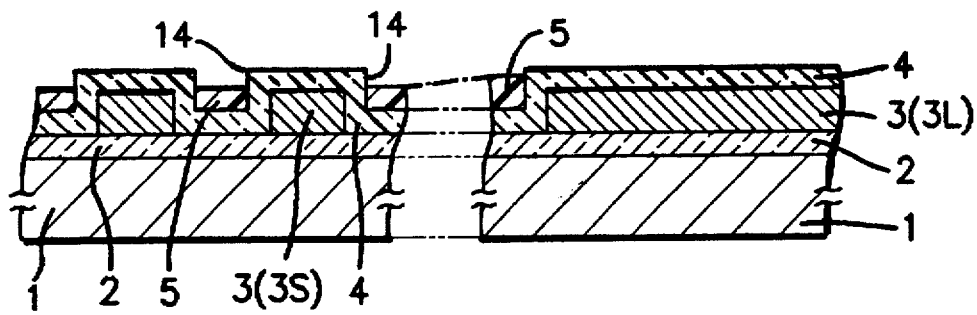

Next, in FIG. 1(B), the SOG film 5 is subjected to a reactive ion etching using an etching gas such as $CF_4$ to remove the SOG film 5 by 0.5 μm from the surface. The reactive ion etching exposes sharp edge parts 14 of the plasma oxide film 4.

Figure 1C:
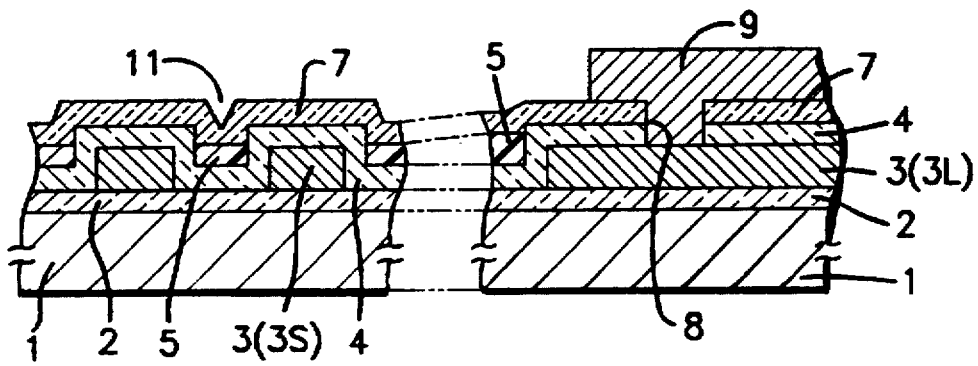

Next, in FIG. 1(C), a 0.5 μm-thick plasma oxide film 7 is grown on the entire surface, a via hole 8 is opened at a desired location, and an upper metal wiring pattern 9 is formed. The reason for giving the etching is to prevent the SOG film from being exposed on the side wall of the via hole. If the SOG film is exposed, moisture is released from the SOG film at the time of formation of a metal film constituting the upper metal wiring pattern, which causes defective conduction. The thickness of the SOG film has a dependence on the surface area of the underlying wiring pattern, and it has a thickness equal to that of the flat part in the case of a very large pattern. In this example, since the thickness of the SOG film 5 over the first wiring part 3L with large area is 0.3 μm, and the thickness of the SOG film 5 over the second wiring part 3S with fine pattern is 0.1 μm, an etchback of 0.3 μm will be appropriate. However, it is necessary in practice to consider the recesses and the projections below the metal wiring as well as the nonuniformity of the etchback amount, so that the necessary etchback amount is considered to be about 1.5 times the thickness of the coating film.

However, since the etching rate of the SOG film at the etchback is larger than the etching rate of the plasma oxide film, sharp edge parts 14 of the plasma oxide film 4 are exposed to form steep steps in the process shown in FIG. 1(B), and a sharp recess 11 as shown in FIG. 1(C) is formed on the top surface of the plasma oxide film 7 covering the edge parts 14, giving rise to a drawback that the flatness of the surface of the dielectric film is deteriorated. That is, as described above, the thickness of the SOG film on the wiring has a dependence on the surface area of the wiring pattern, being formed thin on the fine wirings, so that an excessive etchback to the SOG film leads to the deterioration of the flatness due to the difference in the etching rate.

Figure 2:
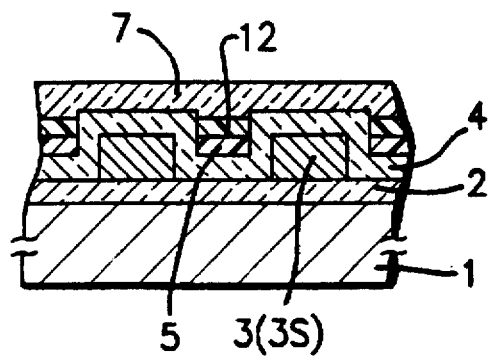
FIG. 2 is a sectional view to describe another conventional method of manufacturing the semiconductor device.

If the amount of the etchback is reduced to prevent the deterioration in the flatness, it causes defective conduction between the upper and the lower wirings as mentioned above. As shown in FIG. 2, there is a method of forming a second SOG film 12 and adding a second etchback in order to recover the deteriorated flatness. However, the method of forming the second SOG film 12 has a reduced cost performance due to the increase in a plurality of different processes, and a sacrifice of the flatness to some extent is inevitable since an excessive etchback is required also in the second etchback.

Next, the method of manufacturing the first embodiment of this invention will be described.

Figure 3A:
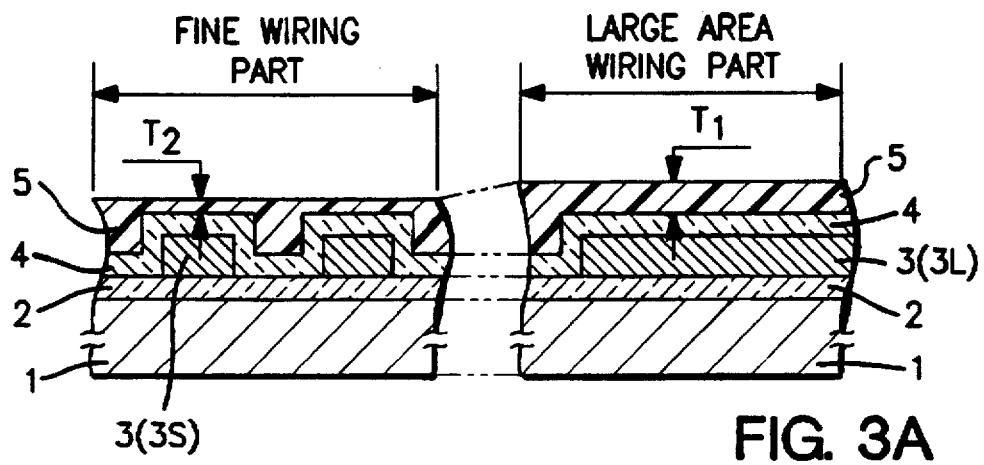
FIG. 3(A) to FIG. 3(D) are sectional views arranged in the order of manufacturing processes to describe the manufacturing method of a first embodiment of the semiconductor device of the invention.

First, in FIG. 3(A), an insulating film 2 such as a field insulating film is formed on one principal surface of a semiconductor substrate 1. An aluminum-based alloy film is formed on an entire surface of the insulating film 2, followed by patterning the film to form a lower metal wiring pattern 3 consisting of an aluminum based alloy. The wiring pattern 3 has a first wiring part 3L with large area and fine second wiring parts 3S with area smaller than that of the first wiring part. Then, a 0.5 μm-thick plasma oxide film 4 is formed on the entire surface by plasma CVD method. Next, the surface is coated with an alcoholic solution of a silicon compound (SOG), followed by subjecting the sample to a heat treatment at 400° C., to thereby obtain a flattened backed SOG film 5 have a thickness of 0.3 μm on the flat part. The SOG film 5 has a thickness $T_1$ of 0.3 μm on the plasma oxide film 4 above the first wiring part 3L with large area, by has a thickness $T_2$ of 0.1 μm on the plasma oxide film 4 above the second wiring parts 3S with small area.

Figure 3B:
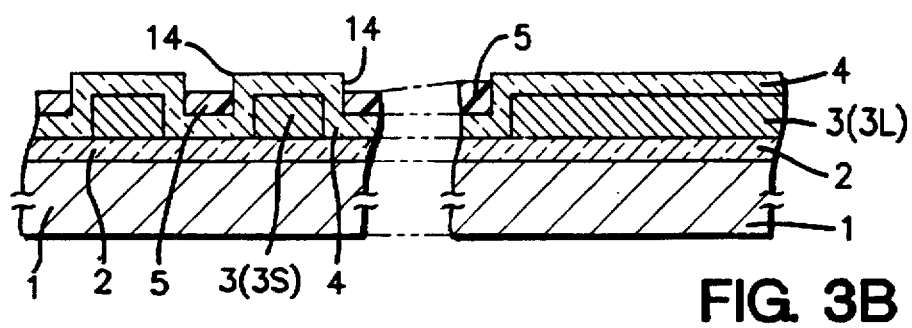

Next, in FIG. 3(B), the SOG film 5 is subjected to an etchback process by reactive ion etching using an etching gas such as $CF_4$ to remove the film 5 by 0.5 μm from the surface and expose a surface of the film 4 located over the first wiring part 3L. At the time of the etchback process, the etching rate for the SOG film 5 is larger than the etching rate for the plasma oxide film 4. In the region where the second wiring parts 3S with small area are formed, there is obtained a shape in which the edge parts 14 of the plasma oxide film 4 covering the second wiring part 3S project conspicuously from the remaining SOG film 5, thereby forming steep steps. In the region where the first wiring part 3L with large area is formed, there is also formed a shape in which the edge part of the plasma oxide film 4 covering the first wiring part 3L projects from the remaining SOG film 5.

Figure 3C:
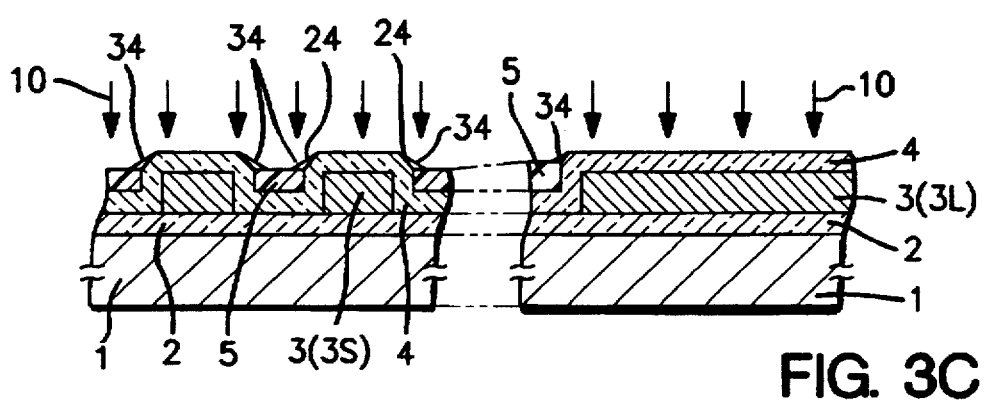

Next, in FIG. 3(C), $Ar^+$ ions 10 with energies in the range of 10 to 100 eV are irradiated on the entire surface from the direction perpendicular to the surface of the substrate 1. In the irradiation of ions with such energies, a sputtering rate for a flat surface, that is, a surface perpendicular to the direction of the ion irradiation, is extremely low. A sputtering rate for a surface tilted with respect to a incident direction is larger than that of the flat surface, with that for the tilt of 45° as a maximum. As a result, the steps become smooth by sputtering to be changed to a tilted edge part 24 with slope angle of about 45° from the steep edge part 14. Moreover, since the sputtered material made of the plasma oxide film 4 reattaches to the bottom part of the steps to form a redeposited film 34, it is possible to convert the edge part 14 and its vicinity of the plasma oxide film 4 into a tapered form part. In this way, a trench shape between the steps formed by the etchback can be smoothed.

Figure 3D:
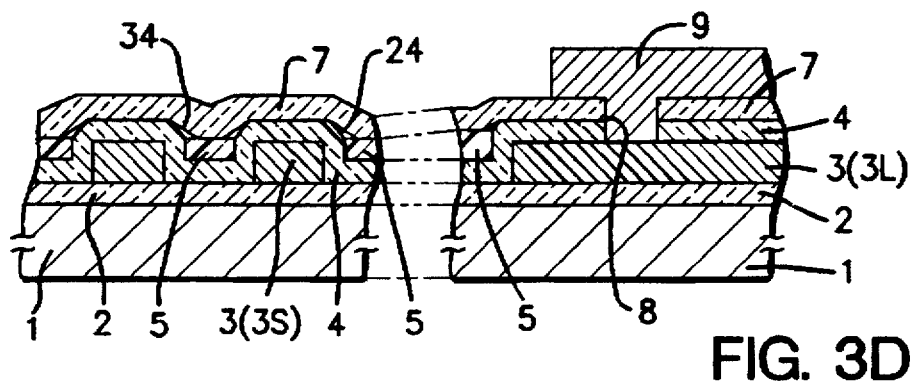

Next, in FIG. 3(D), a 0.5 μm-thick plasma oxide film 7 is formed on an entire surface of the oxide film 4 and the SOG film 5. Further, a via hole 8 is opened at a desired location, for example, at the location which exposes the wiring part 3L by penetrating the plasma oxide film 7 and the plasma oxide film 4, and an upper metal wiring pattern 9 consisting of an aluminum-based alloy is formed. As described above, since the surface of the portions between the lower wirings 3S is made smooth by the process in FIG. 3(C), the top surface of the plasma oxide film 7 formed on it is also made smooth, and the step coverage for the film formed (not shown) on top of it becomes satisfactory.

Figure 4:
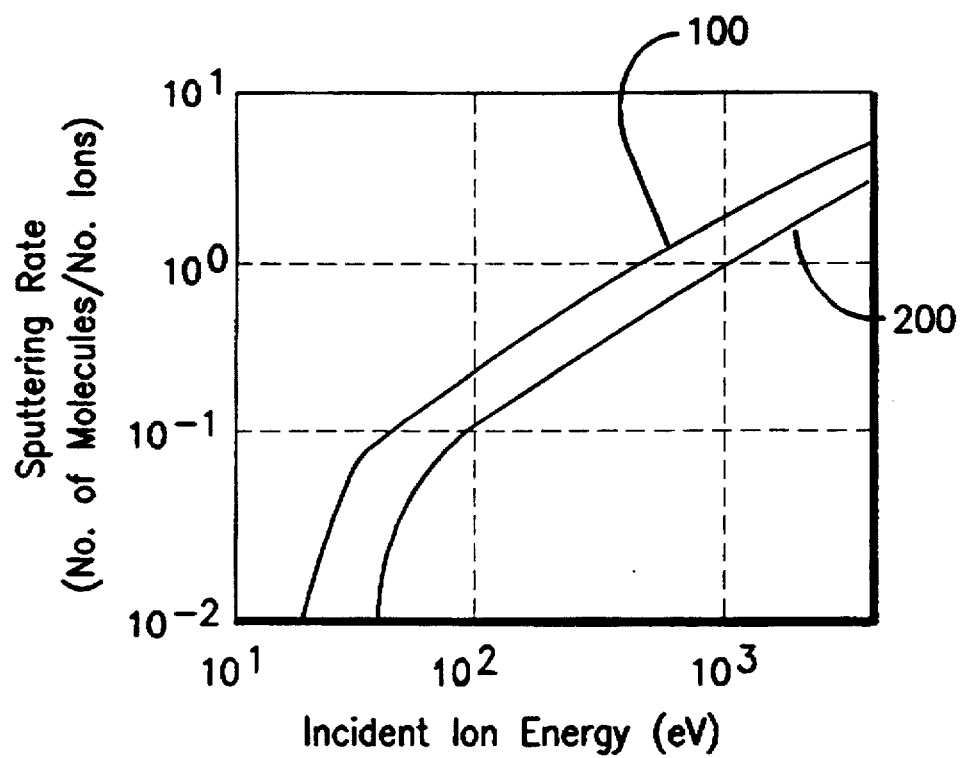
FIG. 4 is a graph showing the dependence of the sputtering rate on the incident ion energy.

In FIG. 4 is illustrated the dependence of the sputtering rate (the number of sputtered molecules to the number of incident ions) on the incident ion energy (eV) for a flat surface (curve 200) and for a surface tilted by 45° (curve 100). An energy higher than 10 eV is required for the sputtering take place. The sputtering rate for the flat surface (curve 200) drops sharply in a region of the ion energy below 100 eV, and by that the ratio of the sputtering rate for the surface tilted by 45° (curve 100) to the sputtering rate for the flat surface (curve 200) rises suddenly. Therefore, the incident ion energies are preferable to be in the range of 10 to 100 eV. Moreover, since it is necessary to have the sputtering rate to be somewhat on the higher side in consideration of the working efficiency, a more preferable range of the incident ion energy is from 50 to 100 eV.

Since the ion energies of the $Ar^+$ ion irradiation are low in this embodiment, it is necessary to raise the ion density in order to shorten the processing time. Accordingly, it is considered appropriate to carry out the irradiation by giving a certain amount of energy in a bias section to the $Ar^+$ ions generated in a plasma generating section, as is done in the ECR system or the inductively coupled plasma system.

According to this embodiment, by means of the $Ar^+$ ion irradiation, it is possible to etch the edge parts 14 of the plasma oxide film 4 exposed by the etchback process of the SOG film 5, and form the vicinity of the edge parts 14 into a tapered surface shape by changing the edge parts 14 of the plasma oxide film 4 to tilted edge parts 24. Moreover, the level differences between the plasma oxide film 4 and the SOG film 5 in the vicinity of the wiring parts 3S generated by the etchback, can be relaxed by the redeposited films 34. In this way, it is possible to further flatten the surface of the plasma oxide film 7 formed later, and flatten the surface of the dielectric film consisting of the plasma oxide film 4, the SOG film 5 and the plasma oxide film 7.

Since the SOG film 5 is formed by coating the surface with an alcoholic solution of a silicon compound and subjecting the sample to baking, there exists a large number of uncoupled bonds within the film, such as Si—OH. Since the uncoupled bonds tend to adsorb moisture, they cause outgassing. According to this embodiment, since the SOG film 5 is also irradiated with the $Ar^+$ ions, the surface portion of the SOG film 5 receives ionic impact and is densified by the recombination of the uncoupled bonds existing there. Conversion of the surface portion of the SOG film 5 to a densified material makes it possible to obtain a dielectric film with high reliability in view of this aspect as well.

Referring to the drawings, a second embodiment of this invention will be described next.

Figure 5A:
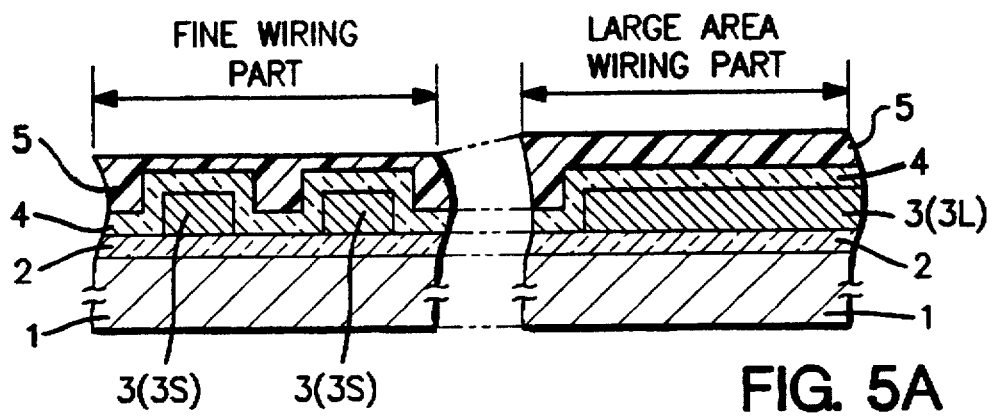
FIG. 5(A) to FIG. 5(D) are sectional views arranged in the order of manufacturing processes to describe the manufacturing method of a second embodiment of the semiconductor device of the invention.

Analogous to the first embodiment, an insulating film 2 such as a field insulating film is formed on one major surface of a semiconductor substrate 1. An aluminum-based alloy film is formed on an entire surface of the lower metal wiring pattern 3 consisting of an aluminum-based alloy, as shown in FIG. 5(A). The wiring pattern 3 has a first wiring part 3L with large surface area and second wiring parts 3S of fine pattern having a smaller surface area than that of the first wiring part 3L. Then, a 0.5 μm-thick plasma oxide film 4 is deposited on the entire surface by a plasma CVD method. Next, the surface is coated with an alcoholic solution of a silicon compound, followed by subjecting the sample to a heat treatment at 400° C., to thereby obtain a flattened baked SOG film 5 have a thickness of 0.3 μm on the flat part. Here, similar to the first embodiment, the thickness of the SOG film 5 is 0.3 μm on the plasma oxide film 4 above the first wiring part 3L with large surface area, but is 0.1 μm on the plasma oxide film 4 above the fine second wiring parts 3S with small surface area.

Figure 5B:
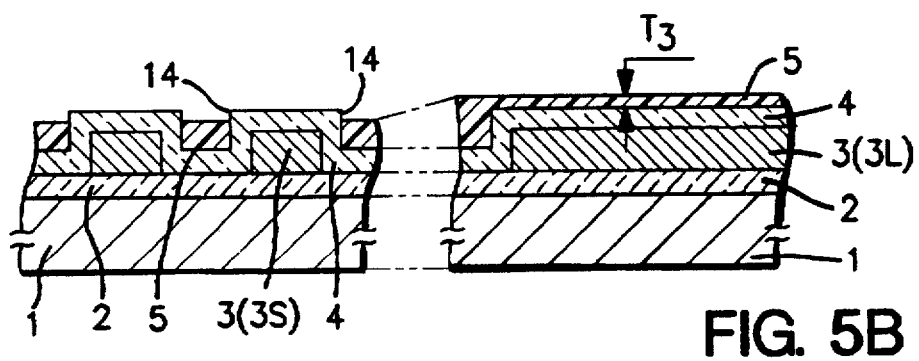

Next, in FIG. 5(B), the SOG film 5 is etched so as to remove the 0.2 μm-thick portion of its surface. As a result, a thin SOG film 5 with thickness $T_3$ of about 0.1 μm is left on the plasma oxide film 4 above the first wiring part 3L with large surface area, and the plasma oxide film 4 above the fine second wiring parts 3S with small surface area is exposed. Since the amount of etching of the SOG film 5 in this embodiment is smaller than that of the first embodiment, a depth of trenches between edge parts 14 above the second wiring parts 3S with small surface area becomes small.

Figure 5C:
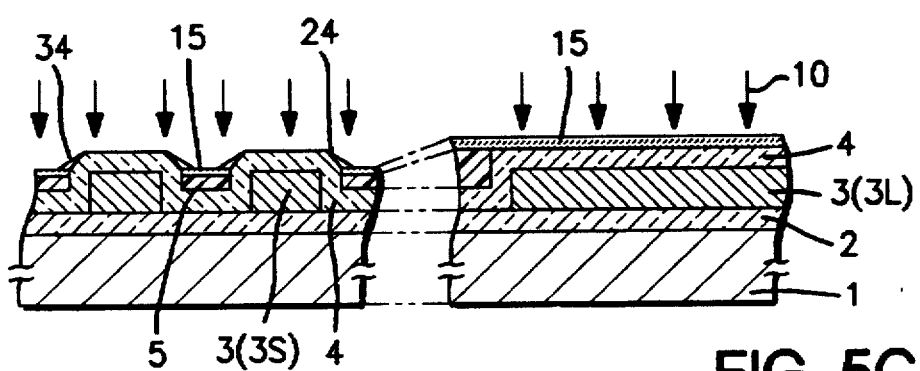

In the next step shown in FIG. 5(C), the entire surface is irradiated with $Ar^+$ ions 10 with energies in the range of 10 to 100 eV in the direction perpendicular to the surface of the substrate 1. Since the depth of the trenches is shallower than in the first embodiment, the upper surface structure becomes flatter than in FIG. 3(C) due to conversion of the steep edge parts 14 to the tilted edge parts 24 of about 45° and the reattachment of the redeposited film 34.

Moreover, since a surface portion of the thin SOG film 5 on the silicon oxide film 4 above the wiring part 3L with large surface area is converted to a densified film 15 by the ionic impact of the ion irradiation, the problem of defective conduction caused by the outgassing in the via hole can also be eliminated. Since, at the same time, the surface of the SOG film 5 above the fine wiring parts 3S with small surface area is also converted to the densified film 15 and produces a structure in which the SOG film 5 which causes the outgassing is covered with the film 15, a dielectric structure with high reliability also in this respect can be obtained.

Figure 5D:
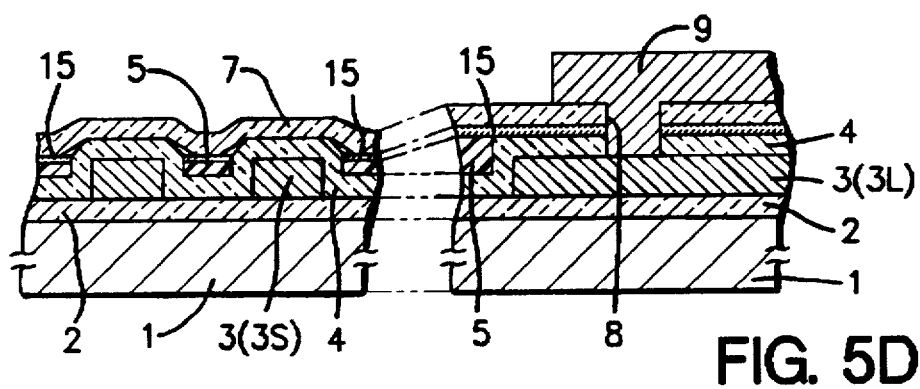

Next, in FIG. 5(D), a 0.5 μm-thick plasma oxide film 7 is deposited on the entire surface of the oxide film 4 and the film 15. Further, a via hole 8 which exposes the wiring part 3L is opened by penetrating the plasma oxide film 7, the densified SOG film 15 and the plasma oxide film 4. Further, an upper wiring pattern 9 consisting of an aluminum-based alloy connected to the wiring part 3L of the lower wiring pattern 3 through the via hole 8 is formed.

As described in the above, since the amount of etching in this embodiment is less than in the first embodiment, the level differences between the plasma oxide film 4 and the SOG film 5 generated in the vicinity of the wiring parts 3S are more relaxed, and the SOG film 5 is left on the plasma oxide film 4 above the wiring part 3L. By subjecting the surface to irradiation with $Ar^+$ ions in such a state, it is possible to etch the edge parts 14 of the plasma oxide film 4 exposed by the etching of the SOG film 5 to change the edge parts of the plasma oxide film 4 into tilted edge parts 24 and form the vicinity of the edge parts 14 into tapered surface shape. In other words, the steep steps between the plasma oxide film 4 and the SOG film 5 in the vicinity of the wiring parts 3S generated by the etching can be relaxed with the redeposited films 34. In this way, it is possible to further flatten the surface of the plasma oxide film 7 formed thereafter, and flatten the surface of a dielectric film consisting of the plasma oxide film 4, the SOG film 5, the densified SOG film 15 and the plasma oxide film 7. Moreover, according to this embodiment, the SOG film 5 is also irradiated with the $Ar^+$ ions including the SOG film 5 left on the plasma oxide film 4 above the wiring part 3L. As a result of the ion irradiation, the surface portion of the SOG film 5 is converted to the densified SOG film 15 due to the recombination of the uncoupled bonds existing in the surface portion of the SOG film 5, and the SOG film 5 left on the plasma oxide film 4 above the wiring part 3L is also converted to the densified SOG film 15. In this way, the moisture absorbing amount of the SOG film 5 can be reduced. In this embodiment, the densified SOG film 15 which tends not to absorb moisture is exposed to the via hole 8, but the SOG film 5 which tends to absorb moisture is not exposed. Therefore, it is possible to prevent the occurrence of defective conduction due to outgassing form the SOG film 5.

The embodiments described above, $Ar^+$ ion irradiation is used to etch the edge parts 14 of the plasma oxide film 4 exposed by the etchback process of the SOG film 5 and to densifying the surface part of the SOG film 5. Other irradiation ions selected from noble gas ions, such as helium (He) ions, neon (Ne) ions, or Krypton (Kr) ion can be utilized instead of the argon (Ar) ion. If another gas comprising fluorine or chlorine is added to the irradiation gas, the flat surfaces of the plasma oxide film 4 and the SOG film 5 are etched as well as the edge parts 14 of the plasma oxide film 4. Therefore, a noble gas ion free from chlorine or fluorine ion is necessary to convert the edge parts 14 to the tilted edge parts 24.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments that fall within the scope of the invention.

What is claimed is:

1. A method of manufacturing a semiconductor device comprising the steps of:

forming a wiring pattern on a first insulating film formed on a major surface of a semiconductor substrate;

forming a second insulating film covering said first insulating film and said wiring pattern;

forming a third insulating film covering said second insulating film by coating and baking;

irradiating the surface of said third insulating film with ions having energies in the range of 10 to 100 eV; and forming a fourth insulating film on said third insulating film.

2. A method of manufacturing a semiconductor device comprising the steps of:

forming a wiring pattern on a first insulating film formed on a major surface of a semiconductor substrate;

forming a second insulating film covering said first insulating film and said wiring pattern;

forming a third insulating film covering said second insulating film by coating and baking, said third insulating film being formed to cover said second insulating film above said wiring pattern;

irradiating the surface of said third insulating film with ions having energies in the range of 10 to 100 eV, said third insulating film located on said second insulating film above said wiring pattern being converted to a densified third insulating film; and forming a fourth insulating film on said third insulating film.

3. The method of manufacturing a semiconductor device as claimed in claim 2, further comprising a step of forming a via hole exposing said wiring pattern by penetrating said second insulating film, said densified third insulating film and said fourth insulating film, and a step of forming a wiring pattern formed above said fourth insulating film and connected to said wiring pattern through said via hole.

4. A method of manufacturing a semiconductor device comprising the steps of:

forming a wiring pattern on a first insulating film formed on a major surface of a semiconductor substrate;

forming a second insulating film covering said first insulating film and said wiring pattern;

forming a third insulating film covering said second insulating film by coating and baking, etching said third insulating film until said second insulating film located above said wiring pattern is exposed;

irradiating the surface of said third insulating film with ions having energies in the range of 10 to 100 eV, and etching said second insulating film to minimize steps between said second insulating film and said third insulating film located in a vicinity of said wiring pattern, a surface portion of said third insulating film being converted to a densified film; and forming a fourth insulating film on said third insulating film.

5. The method of manufacturing a semiconductor device as claimed in claim 1, wherein said ions are selected form noble gas ions.

6. The method of manufacturing a semiconductor device as claimed in claim 2, wherein said ions are selected from noble gas ions.

7. The method of manufacturing a semiconductor device as claimed in claim 4, wherein said ions are selected from noble gas ions.

* * * * *